United States Patent
Konno et al.

(10) Patent No.: US 7,723,731 B2
(45) Date of Patent: May 25, 2010

(54) SEMICONDUCTOR LIGHT EMITTING DEVICE

(75) Inventors: Taichiroo Konno, Hitachi (JP); Takashi Furuya, Hitachi (JP)

(73) Assignee: Hitachi Cable, Ltd., Tokyo (JP)

( * ) Notice: Subject to any disclaimer, the term of this patent is extended or adjusted under 35 U.S.C. 154(b) by 176 days.

(21) Appl. No.: 11/907,895

(22) Filed: Oct. 18, 2007

(65) Prior Publication Data
US 2008/0093619 A1   Apr. 24, 2008

(30) Foreign Application Priority Data
Oct. 19, 2006   (JP)   ............................ 2006-284988

(51) Int. Cl.
*H01L 33/00*   (2006.01)
(52) U.S. Cl. .......................... 257/79; 257/14; 257/96; 257/97; 257/E33.008; 438/22
(58) Field of Classification Search .................. 257/79, 257/80, 86, E33.008, 96–100, 13–15, E33.09, 257/E33.003; 438/22
See application file for complete search history.

(56) References Cited

U.S. PATENT DOCUMENTS

| 5,008,718 A | 4/1991 | Fletcher et al. |
| 6,936,858 B1 | 8/2005 | Nakatsu et al. |
| 2002/0104997 A1* | 8/2002 | Kuo et al. ................. 257/79 |
| 2003/0111667 A1* | 6/2003 | Schubert .................. 257/98 |
| 2003/0209704 A1* | 11/2003 | Yamada .................. 257/14 |
| 2004/0227151 A1* | 11/2004 | Konno et al. ............. 257/103 |
| 2005/0156185 A1* | 7/2005 | Kim et al. ................. 257/99 |
| 2007/0224714 A1* | 9/2007 | Ikeda et al. .............. 438/26 |

FOREIGN PATENT DOCUMENTS

| CN | 1245979 A | 3/2000 |
| JP | 2002-217450 | 8/2002 |
| JP | 2006-135214 | 5/2006 |

OTHER PUBLICATIONS

Chinese Office Action dated Sep. 26, 2008 with English-Language Translation.

* cited by examiner

*Primary Examiner*—Lynne A Gurley
*Assistant Examiner*—Yosef Gebreyesus
(74) *Attorney, Agent, or Firm*—McGinn IP Law Group, PLLC

(57) ABSTRACT

A first conductivity type cladding layer 2, a first side multilayer 9, an active layer 4, a second side multilayer 10, and a second conductivity type cladding layer 3 are provided in a semiconductor light emitting device. The first side multilayer 9 is provided between the first conductivity type cladding layer 2 and the active layer 4, and the second side multilayer 10 is provided between the active layer 4 and the second conductivity type cladding layer 3. Each of the multilayer 9, 10 is transparent with respect to the light generated at the active layer 4, having a bandgap larger than that of the active layer 4, and lattice-matched with the active layer 4.

15 Claims, 8 Drawing Sheets

SEMICONDUCTOR LIGHT EMITTING DEVICE

The present application is based on Japanese Patent Application No. 2006-284988 filed on Oct. 19, 2006, the entire contents of which are incorporated herein by reference.

BACKGROUND OF THE INVENTION

1. Field of the Invention

The present invention relates to a semiconductor light emitting device, in more particularly to a semiconductor light emitting device, in which a current spreading property can be improved without increasing a thickness of an active layer, a thickness of a semiconductor layer and an area of a first electrode.

2. Related Art

As to a light emitting diode (LED) which is a semiconductor light emitting device, it is possible to fabricate a high luminance LED emitting various color lights such as blue, green, orange, yellow, and red, since it is possible to grow a GaN based high quality crystal or an AlGaInP based high quality crystal by using MOVPE (Metal Organic Vapor Phase Epitaxy) method in recent years. In accordance with the provision of a high luminance light emitting diode, applications of the LED are widened, e.g. a back light of a liquid crystal display, a brake lump for a vehicle, so that demand for the LED increases year by year.

Since the growth of a high quality crystal by the MOVPE method has been achieved, a light emitting efficiency inside the light emitting device is nearing to a theoretical limit value. However, the light extract efficiency from the light emitting device to the outside is still low, and enhancement of the light extract efficiency is expected.

For example, a high luminance red LED is made from AlGaInP based materials, and has a double hetero structure comprising a conductive GaAs substrate, an n-type AlGaInP layer comprising an AlGaInP based material with a composition which is lattice-matched with the conductive GaAs substrate, a p-type AlGaInP layer, and an active layer which is a part of a light emitting part comprising AlGaInP or GaInP, and the active layer is sandwiched by the n-type AlGaInP layer and the p-type AlGaInP layer. The AlGaInP based material here is a general term of various kinds of materials mainly comprising AlGaInP, in that composition ratios or additives are different from each other. In the semiconductor light emitting device using AlGaInP based material, materials such as GaInP, GaP may be used together.

Since a bandgap of the GaAs substrate is narrower than that of the active layer in such a semiconductor light emitting device, most of the light emitted from the active layer is absorbed by the GaAs substrate, so that the light extract efficiency is deteriorated.

As means for solving this problem, there is a technique for improving the light extract efficiency by forming a layer with a multilayer reflective film structure comprising semiconductors having different refractive indices between the active layer and the GaAs substrate to reflect the light emitted to the GaAs substrate, thereby reducing an absorption of the light in the GaAs substrate. However, according to this technique, only the light having a limited incident angle with respect to the multilayer reflective film structure layer is reflected. In other words, only a part of the light emitted to the GaAs substrate is reflected, so that it is difficult to improve the light extract efficiency enough.

Thus, Japanese Patent Laid-Open No. 2002-217450 discloses another technique for realizing a high luminance by manufacturing a semiconductor light emitting device in which a double hetero structure part comprising AlGaInP based material is grown on a GaAs substrate for growth, sticking the double hetero structure part on a supporting substrate such as Si or GaAs thereafter via a metal layer with a high reflectance, and removing the GaAs substrate used for the growth. According to this technique, since the metal is used as a reflective layer, the reflection with high reflectance can be realized without selecting an incident angle with the reflective layer. For this reason, it is possible to provide a higher luminance than the aforementioned technique in which the multilayer reflective film structure is formed. In other words, it is possible to achieve the higher luminance by extracting the light generated in the active layer more effectively.

In the conventional semiconductor light emitting device, a thickness of the semiconductor layer (epitaxial layer) is increased to improve the current spreading, thereby realizing the high luminance. However, in the semiconductor light emitting device in which the high luminance is achieved by effectively reflecting a light at a reflective metal film, a step for removing and sticking a substrate is required, so that the thickness of the semiconductor layer cannot be much increased. When the thickness of the semiconductor layer is increased, a warping of the epitaxial wafer is also increased, so that it is difficult to conduct the step of removing and sticking the substrate, thereby deteriorating a production yield.

Further, there is a disadvantage in a material cost when the thickness of the semiconductor layer is increased.

So as to solve this problem, as a technique for improving the current spreading (current dispersion) without increasing the thickness of the semiconductor layer, a configuration in which a first electrode comprises a narrow wire electrode is proposed. According to this structure, the current spreading can be improved in accordance with an increase in an area of the first electrode by using the narrow wire. However, there is disadvantage in that the light is difficult to be extracted to the outside, since an area of a shadow of the first electrode is increased. Namely, there is a trade-off relationship between the current spreading and the light extract. In more concrete, the change in the area of the first electrode is affected by the trade-off relationship between the improvement in the current spreading and the increase in the shadow of the first electrode.

In the semiconductor light emitting device, in which the high luminance is achieved by effective reflecting the light at the reflective metal film, the light emitted from the active layer is reflected at the reflective metal film and transmitted again through the active layer. However, since the active layer is not perfectly transparent with respect to the emitted light, the light reflected at the reflective metal film is absorbed in the active layer to some extent. So as to reduce the absorption of the light, it is desirable to reduce a thickness of the active layer. However, when the thickness of the active layer is excessively reduced, there is a disadvantage in that the light output is deteriorated due to an overflow of carriers.

SUMMARY OF THE INVENTION

Accordingly, so as to solve the above problem, it is an object of the present invention to provide a semiconductor light emitting device, in which a current spreading property can be improved without increasing a thickness of an active layer, a thickness of a semiconductor layer and an area of a first electrode.

According to a first feature of the invention, a semiconductor light emitting device comprises:

a plurality of AlGaInP based semiconductor layers comprising:
   a first conductivity type cladding layer;
   a second conductivity type cladding layer; and
   an active layer sandwiched by the first conductivity type cladding layer and the second conductivity type cladding layer and generating a light;
a first electrode for partially covering a main surface provided at a first conductivity type cladding layer side;
a second electrode for covering an opposite surface provided at a second conductivity type cladding layer side; and
a reflective metal film provided between the second conductivity type cladding layer and the second electrode and reflecting the light advanced from the active layer;
wherein a multilayer is provided at least one of between the first conductivity type cladding layer and the active layer, and between the active layer and the second conductivity type cladding layer, the multilayer being transparent with respect to the light generated at the active layer, having a bandgap larger than that of the active layer, and lattice-matched with the active layer.

According to a second feature of the invention, in the semiconductor light emitting device, the multilayer may comprise an $(Al_{X1}Ga_{1-X1})_{Y1}In_{1-Y1}P$ ($0.3 \leq X1 < 1$, $0.4 \leq Y1 \leq 0.6$).

According to a third feature of the invention, in the semiconductor light emitting device, a thickness of each layer constituting the multilayer is preferably from 3 nm to 15 nm.

According to a fourth feature of the invention, the semiconductor light emitting device may further comprise:

a second conductivity type cladding layer side contact layer comprising a material selected from a group consisting of GaP, AlGaAs, GaAsP, AlGaInP, and GaInP, the second conductivity type cladding layer side contact layer being provided at a second electrode side of the second conductivity type cladding layer.

According to a fifth feature of the invention, the semiconductor light emitting device may further comprise:

an interposed layer comprising $Ga_XIn_{1-X2}P$ ($0.6 \leq X2 < 1$), the interposed layer being provided between the first conductivity type cladding layer and the second conductivity type cladding layer side contact layer.

According to a sixth feature of the invention, in the semiconductor light emitting device, the second conductivity type cladding layer side contact layer may comprise a plurality of divided contact layers including an undoped layer.

According to a seventh feature of the invention, in the semiconductor light emitting device, other divided contact layers sandwiching the undoped layer may comprise materials containing conductivity type determination impurities different from each other.

According to an eighth feature of the invention, in the semiconductor light emitting device, it is preferable that one of the other divided contact layers is doped with Mg and another one is doped with Zn.

According to a ninth feature of the invention, in the semiconductor light emitting device, the active layer may comprise a multiquantum well structure in which the pair number is from 5 to 40.

According to a tenth feature of the invention, in the semiconductor light emitting device, the active layer may comprise a single structure and a film thickness of the active layer is from 20 nm to 200 nm.

According to an eleventh feature of the invention, in the semiconductor light emitting device, a first conductivity type determination impurity contained in a material of the first conductivity type cladding layer may be selected from a group consisting of Te, Se, and Si.

According to a twelfth feature of the invention, in the semiconductor light emitting device, a second conductivity type determination impurity contained in a material of the second conductivity type cladding layer may be selected from a group consisting of Mg and Zn.

According to a thirteenth feature of the invention, the semiconductor light emitting device may further comprise:

a first electrode side contact layer provided between the AlGaInP based semiconductor layers and the first electrode, which covers a part covered by the first electrode and has a bandgap energy smaller than that of the active layer.

According to a fourteenth feature of the invention, in the semiconductor light emitting device, each of the first conductivity type cladding layer, the second conductivity type cladding layer, and the active layer may comprise an $(Al_XGa_{1-X})_YIn_{1-Y}P$ ($0 < X < 1$, $0.4 \leq Y \leq = 0.6$).

According to a fifteenth feature of the invention, in the semiconductor light emitting device, a plurality of ohmic contact portions may be provided in regions between the AlGaInP based semiconductor layers and the reflective metal film, the regions being not covered by the first electrode.

According to a sixteenth feature of the invention, in the semiconductor light emitting device, an oxide layer may be provided between the ohmic contact portions that are sandwiched by the AlGaInP based semiconductor layers and the reflective metal film.

According to a seventeenth feature of the invention, in the semiconductor light emitting device, a film thickness D of the oxide layer may be within a range of ±30% of a value d expressed as:

$$d = A \times \lambda p / 4 \times n$$

(d is the film thickness of the oxide layer, A is a constant of an odd number, $\lambda p$ is a wavelength of the light emitted from the active layer, and n is a refractive index of the light emitted from the active layer).

According to an eighteenth feature of the invention, in the semiconductor light emitting device, the oxide layer may comprise at least one of $SiO_2$ and SiN.

According to a nineteenth feature of the invention, in the semiconductor light emitting device, an irregularity may be formed on a main surface at the first conductivity type cladding layer side of the AlGaInP based semiconductor layers.

According to a twentieth feature of the invention, in the semiconductor light emitting device may further comprise:

a main surface oxide layer provided on a main surface at the first conductivity type cladding layer side of the AlGaInP based semiconductor layers, the main surface oxide layer comprising an oxide material having a refractive index between a refractive index of the AlGaInP based semiconductor layers and a refractive index of the air or between the refractive index of AlGaInP based semiconductor layers and a refractive index of a resin.

According to a twenty-first feature of the invention, in the semiconductor light emitting device, the main surface oxide layer may comprise at least one of $SiO_2$ and SiN.

According to the present invention, a following superior effect can be obtained.

Namely, the current spreading property can be improved without increasing the thickness of the active layer, the thickness of the semiconductor layer and the area of the first electrode.

BRIEF DESCRIPTION OF THE DRAWINGS

The present invention will be explained in more detail in conjunction with appended drawings, wherein.

DETAILED DESCRIPTION OF THE PREFERRED EMBODIMENTS

Next, the preferred embodiments according to the present invention will be explained in more detail in conjunction with the appended drawings.

Figure 7:
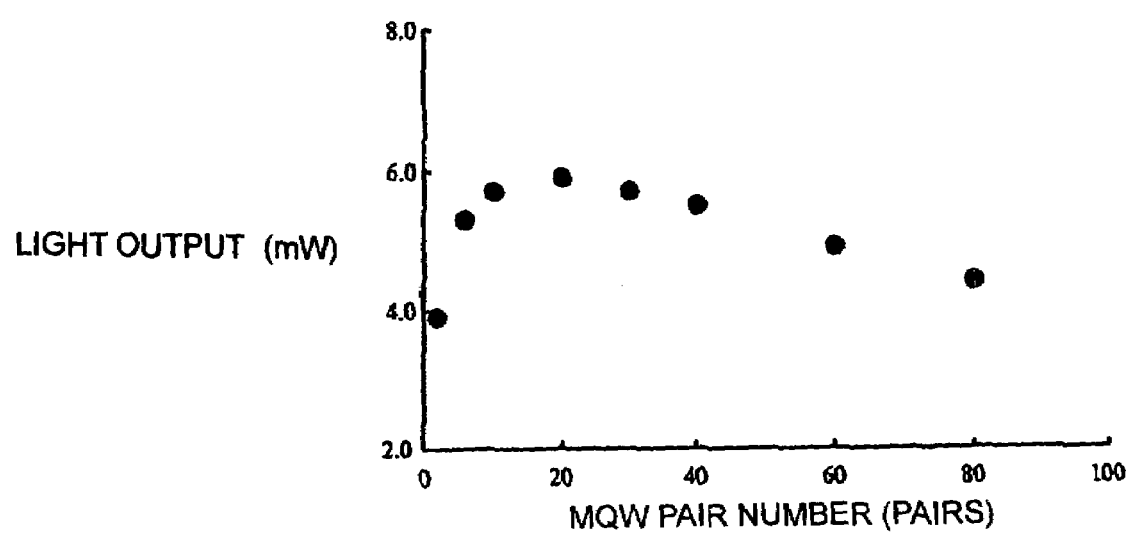
FIG. 7 is a graph showing a relationship between a light output and the number of MQW pairs of the semiconductor light emitting device in the preferred embodiment according to the invention.
Figure 8:
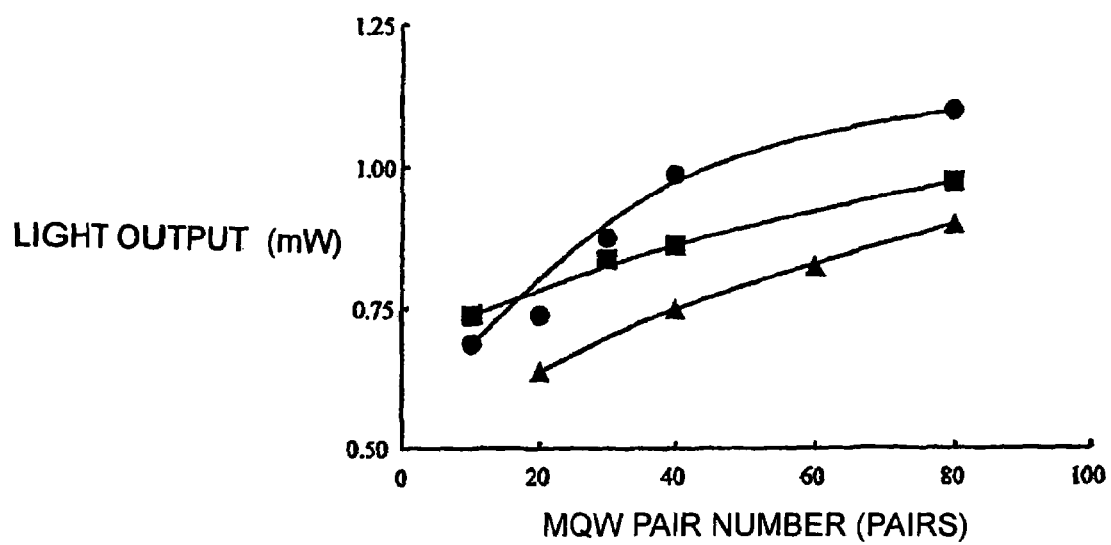
FIG. 8 is a graph showing a relationship between a light output and the number of MQW pairs of the semiconductor light emitting device of the comparative example.

The Inventors eagerly studied so as to solve the aforementioned problem in the conventional semiconductor light emitting device, and found that the current spreading property can be improved in accordance with an increase in the number of pairs of multiquantum well (MQW) layers constituting the active layer as shown in FIGS. 7 and 8. However, when the thickness of the active layer is increased, the light absorption is also increased, so that the increase in the thickness of the active layer does not immediately provide the improvement in a light output efficiency.

As a result of a further effort, the Inventors found that the current spreading property can be enhanced by adding a hetero structure layer (hereinafter, referred as "multilayer") similar to the MQW layer, by using a transparent material with respect to the light emitted from the active layer, without increasing the active layer itself. As described above, as a result of providing the multilayer without increasing the active layer, a light absorption loss in the semiconductor light emitting device can be decreased compared with the conventional device and a current spreading property equal to the conventional device can be provided, thereby realizing a semiconductor light emitting device with high efficiency and high luminance.

Figure 1:
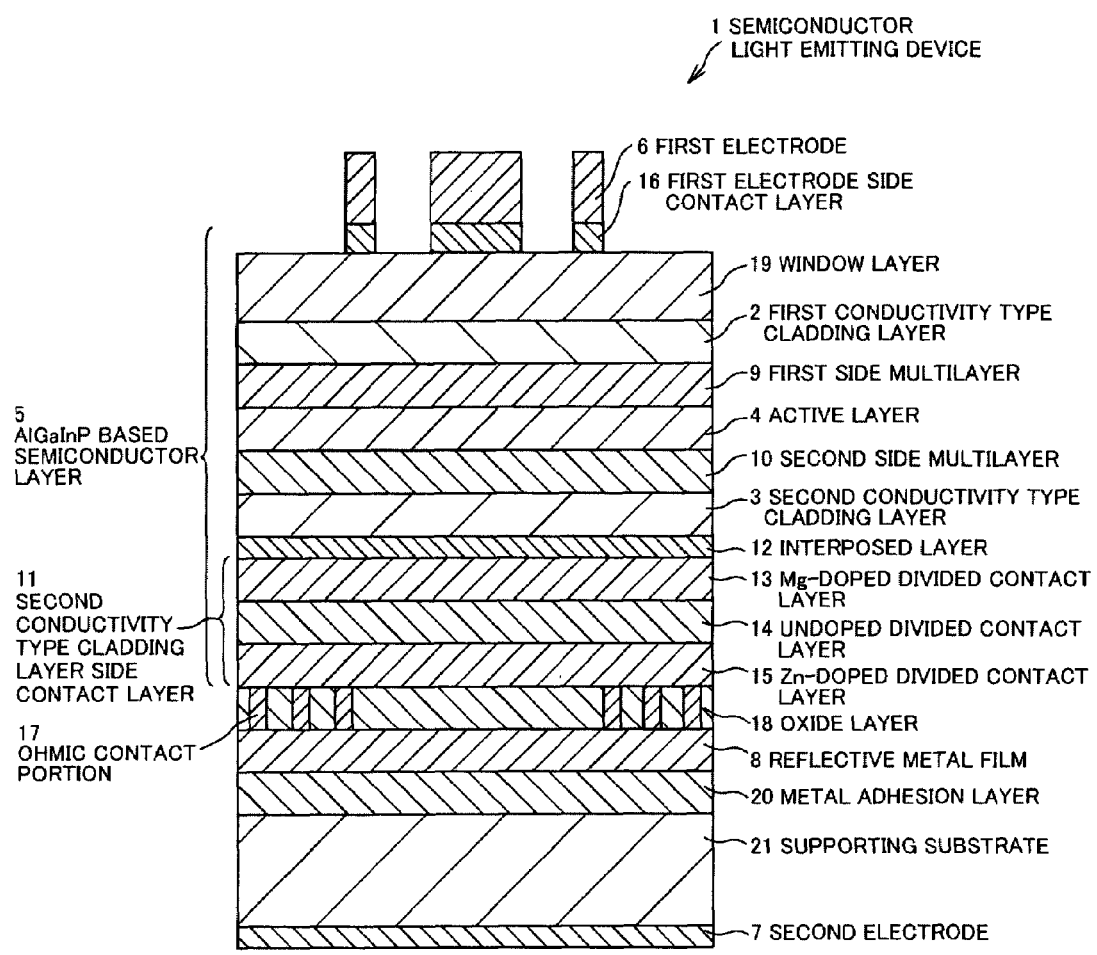
FIG. 1 is a schematic cross sectional view showing a structure of a semiconductor light emitting device in a first preferred embodiment according to the present invention.

FIG. 1 is a schematic cross sectional view showing a structure of a semiconductor light emitting device in a first preferred embodiment according to the present invention.

As shown in FIG. 1, a semiconductor light emitting device 1 in the first preferred embodiment according to the invention comprises, a plurality of AlGaInP based semiconductor layers 5 including a first conductivity type cladding layer 2, a second conductivity type cladding layer 3, and an active layer 4 sandwiched by the first conductivity type cladding layer 2 and the second conductivity type cladding layer 3 and generating a light, a first electrode 6 for partially covering a main surface provided at a side of the first conductivity type cladding layer 2, a second electrode 7 for covering an opposite surface provided at a side of the second conductivity type cladding layer 3, and a reflective metal film 8 provided between the second conductivity type cladding layer 3 and the second electrode 7 and reflecting the light advanced from the active layer 4, in which a first side multilayer 9 is provided between the first conductivity type cladding layer 2 and the active layer 4, and a second side multilayer 10 is provided between the active layer 4 and the second conductivity type cladding layer 3. Each of the first and second side multilayers 9, 10 is transparent with respect to the light generated at the active layer 4, having a bandgap larger than that of the active layer 4, and lattice-matched with the active layer 4.

A material of each of the first and second side multilayers 9, 10 may be expressed as $(Al_XGa_{1-X})_YIn_{1-Y}P$ ($0.3 \leq X < 1$, $0.4 \leq Y \leq 0.6$).

The first and second side multilayers 9, 10 are respectively formed by laminating a number of layers. A thickness of each layer constituting the first and second side multilayers 9, 10 may be from 3 nm to 15 nm. A total thickness of each of the first and second side multilayers 9, 10 is preferably from 50 nm to 500 nm.

A second conductivity type cladding layer side contact layer 11 comprising a material selected from a group consisting of GaP, AlGaAs, GaAsP, AlGaInP, and GaInP is provided at the second electrode side of the second conductivity type cladding layer 3.

An interposed layer 12 comprising $Ga_XIn_{1-X}P$ ($0.6 \leq X < 1$) is provided between the first conductivity type cladding layer 3 and the second conductivity type cladding layer side contact layer 11.

The second conductivity type cladding layer side contact layer 11 comprises a plurality of divided contact layers 13, 14, and 15. In this preferred embodiment, three layers (first to third divided contact layers 13 to 15) are provided. The second divided contact layer 14 which is one of the first to third divided contact layers 13, 14, and 15 comprises an undoped layer, to which a conductivity type determination impurity (dopant) is not positively doped.

The first and third divided contact layers 13 and 15 sandwiching the undoped second divided contact layer 14 comprise materials containing conductivity type determination dopants different from each other.

The dopant contained in the first divided contact layer 13 is Mg, and the dopant contained in the third divided contact layer 15 is Zn. Namely, Mg is contained in a material of the first divided contact layer 13 located at the first electrode side of the second conductivity type cladding layer side contact layer 11 and adjacent to the interposed layer 12. Zn is contained in a material of the third divided contact layer 15 located at the second electrode side of the second conductivity type cladding layer side contact layer 11.

The active layer 4 comprises a multiquantum well (MQW) structure in which the pair number is from 5 to 40. The active layer 4 may comprise a single structure, in which a film thickness of the active layer 4 may be from 20 nm to 200 nm. The active layer 4 may comprise a strained multiquantum well structure.

The first conductivity type dopant contained in the material of the first conductivity type cladding layer 2 is a dopant selected from a group consisting of Te, Se, and Si.

The second conductivity type dopant contained in the material of the second conductivity type cladding layer 3 is a dopant selected from a group consisting of Mg and Zn.

A first electrode side contact layer 16 is provided between the AlGaInP based semiconductor layers 5 and the first electrode 6. The first electrode side contact layer 16 covers a part same as the part covered by the first electrode 6, and has a bandgap energy smaller than that of the active layer 4.

A material of each of the first conductivity type cladding layer 2, the second conductivity type cladding layer 3, and the active layer 4 may be expressed as $(Al_xGa_{1-x})_yIn_{1-y}P$ ($0<X<1$, $0.4 \leq Y \leq 0.6$).

A plurality of ohmic contact portions 17 are provided in regions between the AlGaInP based semiconductor layers 5 and the reflective metal film 8, which are not covered by the first electrode 6. In other words, the ohmic contact portions 17 are not provided at regions corresponding to the first electrode 6.

An oxide layer 18 is provided between the ohmic contact portions 17 that are sandwiched by the AlGaInP based semiconductor layers 5 and the reflective metal film 8. In other words, the oxide layer 18 is provided between the AlGaInP based semiconductor layers 5 and the reflective metal film 8, and the oxide layer 18 is divided into the ohmic contact portion 17 and non-ohmic contact portions.

A film thickness D of the oxide layer 18 may be within a range of ±30% of a value d expressed as:

$$d = A \times \lambda p / 4 \times n$$

(A is a constant of an odd number, λp is a wavelength of the light emitted from the active layer, and n is a refractive index of the light emitted from the active layer).

The oxide layer 18 comprises at least one of $SiO_2$ and SiN.

In the semiconductor light emitting device 1 shown in FIG. 1, a window layer 19 is further provided between the first conductivity type cladding layer 2 and the first electrode side contact layer 16. A metal adhesion layer 20 is provided at the second electrode side of the reflective metal film 8, and a GaAs supporting substrate 21 is provide between the metal adhesion layer 20 and the second electrode 7.

Next, a method for fabricating the semiconductor light emitting device 1 will be explained with referring to FIGS. 1 and 2.

Figure 2:
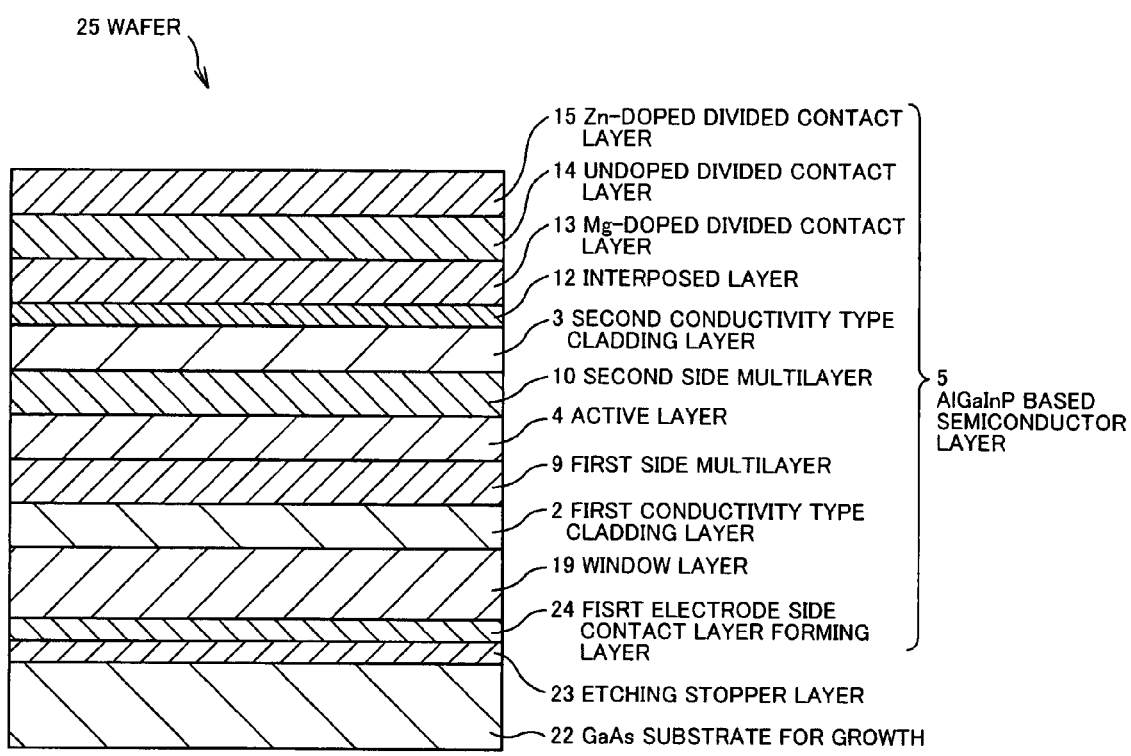
FIG. 2 is a schematic cross sectional view showing a structure of a wafer for manufacturing a semiconductor light emitting device in the first preferred embodiment according to the present invention.

FIG. 2 is a schematic cross sectional view showing a structure of a wafer for manufacturing a semiconductor light emitting device in the first preferred embodiment according to the present invention.

As shown in FIG. 2, an etching stopper layer 23, a layer 24 for forming first electrode side contact layer 16, a window layer 19, a first conductivity type cladding layer 2, a first side multilayer 9, an active layer 4, a second side multilayer 10, a second conductivity type cladding layer 3, an interposed layer 12, and a second conductivity type cladding layer side contact layer 11 (a Mg-doped divided contact layer 13, an undoped divided contact layer 14, and a Zn-doped divided contact layer 15) are sequentially grown in this order on n-type (Si-doped) GaAs substrate (light absorbing semiconductor substrate) 22 for growth, to provide a wafer 25 on which AlGaInP based semiconductor layers 5.

On a surface of the Zn-doped divided contact layer 15 in this wafer 25, a layer (not shown) is formed for forming an oxide layer 18. An opening (hole) for forming an ohmic contact portion 17 is provided at this layer, and the ohmic contact portion 17 is formed in this hole. A portion other than the ohmic contact portion 17 is the oxide layer 18, namely, non-ohmic contact portion of the oxide layer 18. A reflective metal film 8, a metal adhesion layer 20, and a GaAs supporting substrate 21 are formed in this order on the ohmic contact portion 17 and the oxide layer 18. Thereafter, the GaAs substrate 22 for growth and the etching stopper layer 23 are removed.

Thereafter, a first electrode 6 is formed on a surface of the layer 24 for forming a first electrode side contact layer 16, and the first electrode side contact layer 16 is formed by using the first electrode 6 as a mask. Then, a second electrode 7 is formed on a surface of the GaAs supporting substrate 21, to provide the semiconductor light emitting device 1 shown in FIG. 1.

In the semiconductor light emitting device 1 according to the present invention, the first side multilayer 9 is provide between the first conductivity type cladding layer 2 and the active layer 4, and the second side multilayer 10 is provided between the active layer 4 and the second conductivity type cladding layer 3. According to this structure, the light absorption loss in the semiconductor light emitting device can be reduced compared with the conventional device, and the current spreading property equal to the conventional device can be realized, thereby realizing the semiconductor light emitting device 1 with high efficiency and high luminance.

Next, a semiconductor light emitting device in a second preferred embodiment will be explained below.

Figure 3:
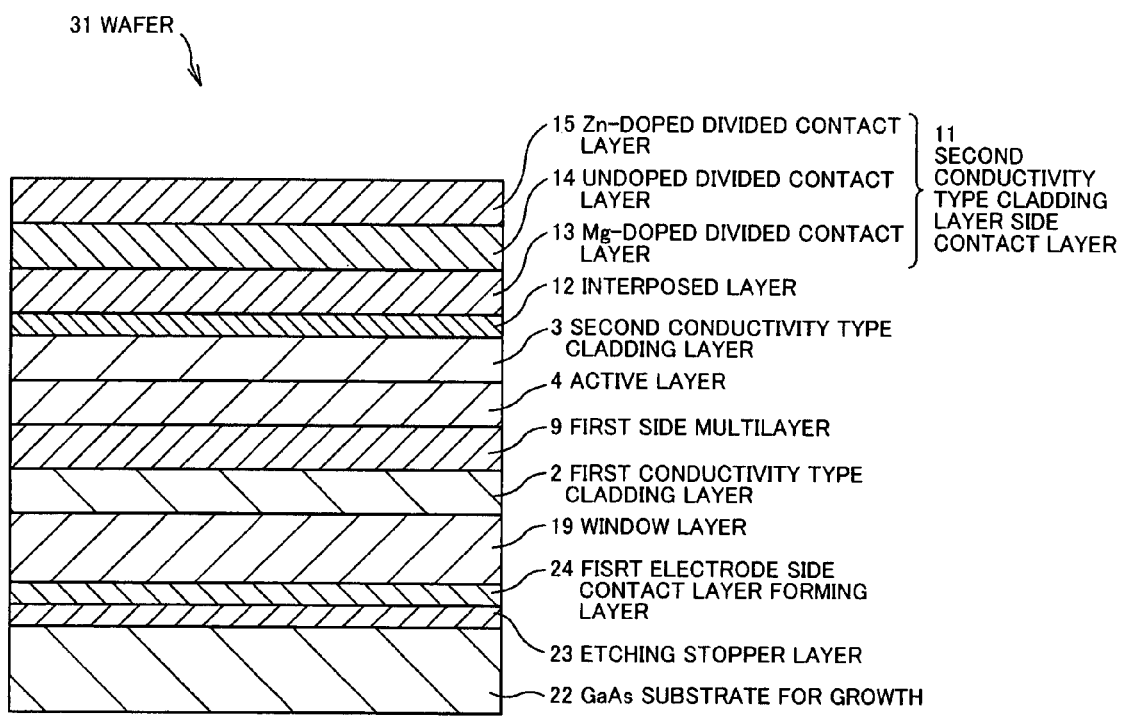
FIG. 3 is a schematic cross sectional view showing a structure of a wafer for manufacturing a semiconductor light emitting device in a second preferred embodiment according to the present invention.

FIG. 3 is a schematic cross sectional view showing a structure of a semiconductor light emitting device in a second preferred embodiment according to the present invention.

As shown in FIG. 3, an etching stopper layer 23, a layer 24 for forming first electrode side contact layer 16, a window layer 19, a first conductivity type cladding layer 2, a first side multilayer 9, an active layer 4, a second conductivity type cladding layer 3, an interposed layer 12, and a second conductivity type cladding layer side contact layer 11 (a Mg-doped divided contact layer 13, an undoped divided contact layer 14, and a Zn-doped divided contact layer 15) are sequentially grown in this order on n-type (Si-doped) GaAs substrate (light absorbing semiconductor substrate) 22 for growth, to provide a wafer 31 on which AlGaInP based semiconductor layers 5.

The wafer 31 is similar to the wafer 25 shown in FIG. 2 except that the second side multilayer 10 is not provided. Similarly to the first preferred embodiment, an oxide layer 18, an ohmic contact portion 17, a reflective metal film 8, a metal adhesion layer 20, a GaAs supporting substrate 21 are formed on the wafer 31, and the GaAs substrate 22 for growth and the etching stopper layer 23 are removed, and a first electrode 6, a first electrode side contact layer 16, as well as a second electrode 7 are formed, to provide the semiconductor light emitting device in the second preferred embodiment.

Next, a semiconductor light emitting device in a third preferred embodiment will be explained below.

Figure 4:
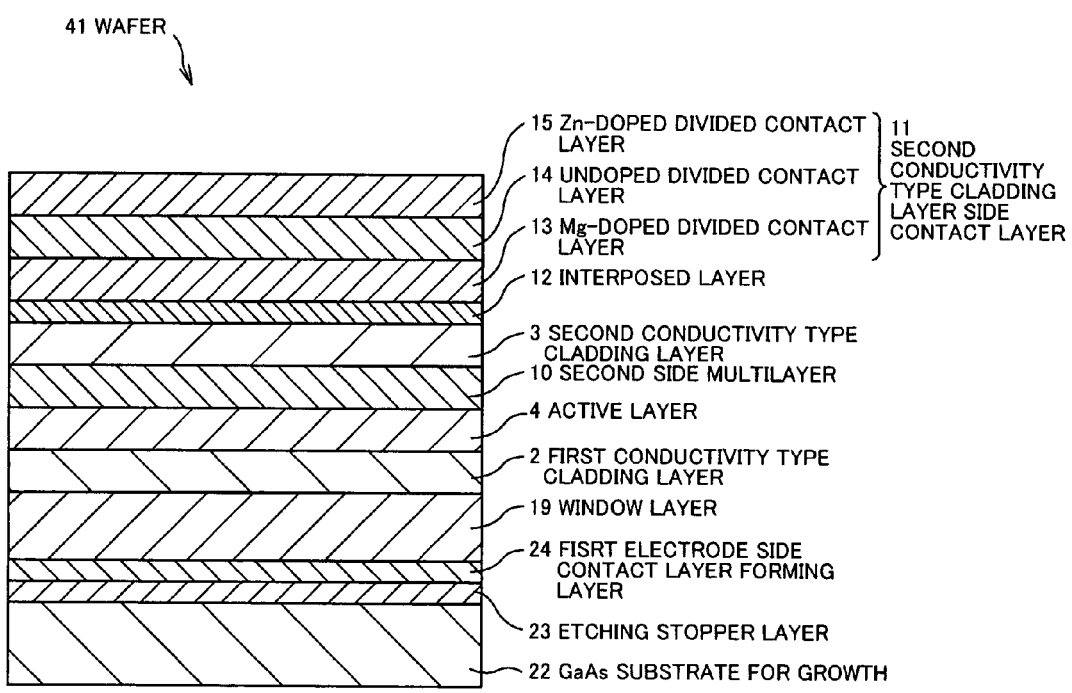
FIG. 4 is a schematic cross sectional view showing a structure of a wafer for manufacturing a semiconductor light emitting device in a third preferred embodiment according to the present invention.

FIG. 4 is a schematic cross sectional view showing a structure of a semiconductor light emitting device in a third preferred embodiment according to the present invention.

As shown in FIG. 4, an etching stopper layer 23, a layer 24 for forming first electrode side contact layer 16, a window layer 19, a first conductivity type cladding layer 2, an active layer 4, a second side multilayer 10, a second conductivity type cladding layer 3, an interposed layer 12, and a second conductivity type cladding layer side contact layer 11 (a Mg-doped divided contact layer 13, an undoped divided contact layer 14, and a Zn-doped divided contact layer 15) are sequentially grown in this order on n-type (Si-doped) GaAs substrate (light absorbing semiconductor substrate) 22 for growth, to provide a wafer 41 on which AlGaInP based semiconductor layers 5.

The wafer 41 is similar to the wafer 25 shown in FIG. 2 except that the first side multilayer 9 is not provided. Similarly to the first preferred embodiment, an oxide layer 18, an ohmic contact portion 17, a reflective metal film 8, a metal adhesion layer 20, a GaAs supporting substrate 21 are formed on the wafer 31, and the GaAs substrate 22 for growth and the etching stopper layer 23 are removed, and a first electrode 6, a first electrode side contact layer 16, as well as a second electrode 7 are formed, to provide the semiconductor light emitting device in the third preferred embodiment.

Next, a semiconductor light emitting device in a fourth preferred embodiment will be explained below.

Figure 5:
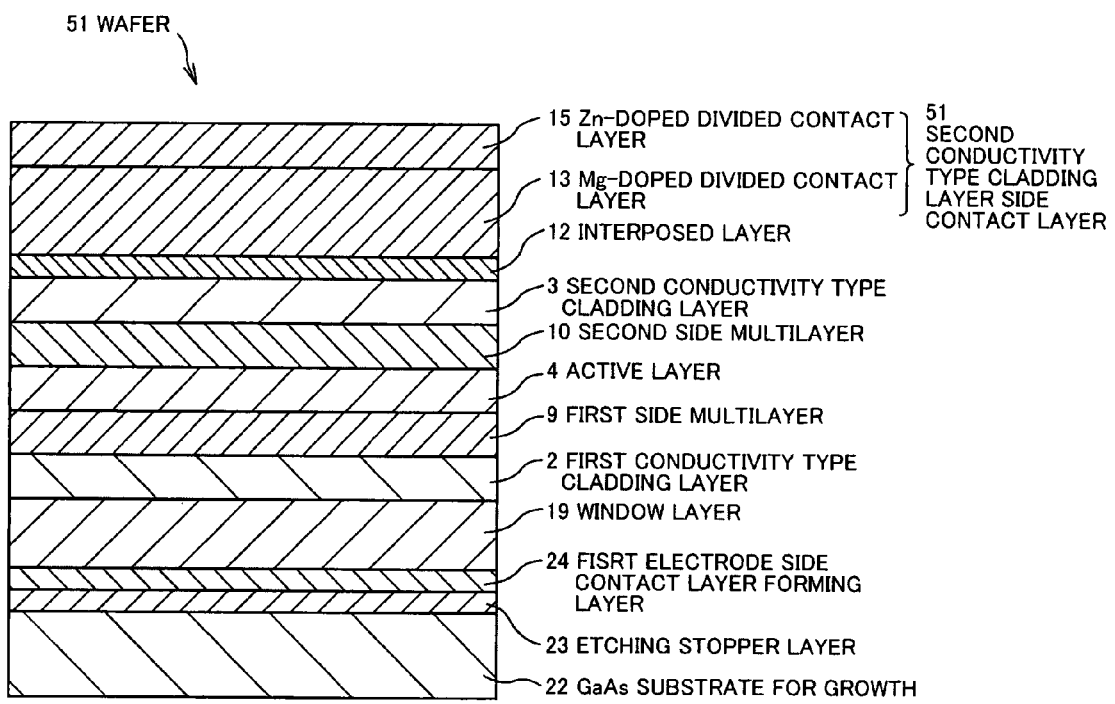
FIG. 5 is a schematic cross sectional view showing a structure of a wafer for manufacturing a semiconductor light emitting device in a fourth preferred embodiment according to the present invention.

FIG. 5 is a schematic cross sectional view showing a structure of a semiconductor light emitting device in a fourth preferred embodiment according to the present invention.

As shown in FIG. 5, an etching stopper layer 23, a layer 24 for forming first electrode side contact layer 16, a window layer 19, a first conductivity type cladding layer 2, a first side multilayer 9, an active layer 4, a second side multilayer 10, a second conductivity type cladding layer 3, an interposed layer 12, and a second conductivity type cladding layer side contact layer 51 (a Mg-doped divided contact layer 13 and a Zn-doped divided contact layer 15) are sequentially grown in this order on n-type (Si-doped) GaAs substrate (light absorbing semiconductor substrate) 22 for growth, to provide a wafer 52 on which AlGaInP based semiconductor layers 5.

The wafer 52 is similar to the wafer 25 shown in FIG. 2 except that the second conductivity type cladding layer side contact layer 51 is provided instead of the second conductivity type cladding layer side contact layer 11. In more concrete, the second conductivity type cladding layer side contact layer 51 comprises first and third divided contact layers 13 and 15 doped with different conductivity type dopants, and the undoped second divided contact layer 14 is not provided. By using the wafer 52, the semiconductor light emitting device in the fourth preferred embodiment is provided.

Preferable conditions for each layer in the first to fourth preferred embodiments and other preferred embodiments will be explained below.

It is preferable that the first side multilayer 9 and the second side multilayer 10 are transparent with respect to the light generated in the active layer 4. However, when a barrier at a hetero interface is too small, an effect for spreading the current is reduced.

Accordingly, when a light emitting peak wavelength is around 630 nm, the material of the first side multilayer 9 and the second side multilayer 10 preferably comprises an $(Al_XGa_{1-X})_YIn_{1-Y}P$ ($0.3 \leq X < 1$, $0.4 \leq Y \leq 0.6$), more preferably comprises an $(Al_XGa_{1-X})_YIn_{1-Y}P$ ($0.35 \leq X < 1$, $0.4 \leq Y \leq 0.6$), and most preferably comprises a combination of an $(Al_XGa_{1-X})_YIn_{1-Y}P$ ($0.35 \leq X \leq 0.4$, $0.4 \leq Y \leq 0.6$) and an $(Al_XGa_{1-X})_YIn_{1-Y}P$ ($0.70 \leq X \leq 0.075$, $0.4 \leq Y \leq 0.6$).

The current spreading effect will be deteriorated when a film thickness of each layer constituting the first side multilayer 9 and the second side multilayer 10 is too thick or too thin. Therefore, the film thickness of the each layer constituting the first side multilayer 9 and the second side multilayer 10 is preferably from 3 nm to 15 nm, and more preferably from 5 nm to 10 nm.

The material of the interposed layer 12 preferably comprises a $Ga_XIn_{1-X}P$ ($0.6 \leq X < 1$), since when a composition ratio x is smaller than 0.6, the light emitted at a wavelength of 630 nm is absorbed in the interposed layer 12. When the light emitting wavelength is different from 630 nm, a preferable value range of the composition ratio x is also varied. When the light emitting wavelength is 595 nm, the range of the composition ratio x is preferably $0.6 < x < 1$.

The third divided contact layer 15 located at the second electrode side of the second conductivity type cladding layer side contact layer 11 preferably comprises a material including Zn. It is because that the Zn is easy to be doped compared with Mg, and a lower resistance can be realized. By doping Zn to the material of the third divided contact layer 15, a contact resistance between the third divided contact layer 15 and the ohmic contact portion 17 can be reduced, thereby reducing a forward voltage of the semiconductor light emitting device 1.

The first divided contact layer 13 located at the first electrode side of the second conductivity type cladding layer side contact layer 11 preferably comprises a material including Mg. It is because that the Zn is difficult to be dispersed compared with Mg, so that it is possible to suppress that loss of crystallinity due to the dispersion of the dopant in the active layer by doping Mg to the material of the first divided contact layer 13. Accordingly, it is possible to suppress deterioration in an initial light output, and to improve the reliability.

In the plurality of the divided contact layers constituting the second conductivity type cladding layer side contact layer 11, the second divided contact layer 14 that is the undoped layer is provided between the third divided contact layer 15 comprising the material doped with Zn and the first divided contact layer 13 comprising the material doped with Mg. It is because that if the third divided contact layer 15 comprising the material doped with Zn is provided adjacent to the first divided contact layer 13 comprising the material doped with Mg, a mutual dispersion of dopants occurs therebetween. It is not preferable, since the mutual dispersion of the dopants causes the dispersion of Zn into the active layer, thereby causing the deterioration in the initial light output and the deterioration in the reliability. Concerning this disadvantage, in the present invention, the second divided contact layer 14 is provided to separate the third divided contact layer 15 from the first divided contact layer 13, so that the mutual dispersion of the dopants can be prevented.

When the active layer 4 has a MQW structure, the active layer 4 preferably comprises 5 to 40 pairs, and more preferably 10 to 40 pairs. The reason therefor is as follows. When the number of pairs is small, the light absorption in the undoped MQW active layer 4 is reduced, so that the light extract efficiency can be increased. However, when the number of pairs is too small, the overflow of electrons or holes occurs, thereby deteriorating internal quantum efficiency and the light output.

When the active layer has a single layer structure, the film thickness of the active layer is preferably from 20 nm to 200 nm for the similar reason. When the film thickness of the active layer 4 is too thin, the light output efficiency is decreased due to the overflow while the light absorption is low. When the film thickness of the active layer 4 is too thick, the light extract efficiency is decreased due to the increase in the light absorption. The film thickness of the active layer 4 is more preferably from 40 nm to 200 nm.

The semiconductor light emitting device 1 has a light emitting wavelength of 630 nm for example. The present invention is still effective, in other LED devices using an AlGaInP based material to have a different light emitting wavelength, for example a wavelength from 560 nm to 660 nm.

A plan view shape of the first electrode 6 may be for example a circular shape provided with radial branches. Further, the first electrode 6 may be circular, rectangular, lozenge, polygonal or heteromorphous (arbitrary shape). The present invention is effective also in this case.

As for a supporting substrate, the present invention is not limited to the GaAs supporting substrate 21. A Ge supporting substrate, a Si supporting substrate, a metallic supporting substrate or the like may be also used. The present invention is effective also in this case.

In the semiconductor light emitting device 1 as shown in FIG. 1, a surface of the window layer 19 which is a main surface of the first conductivity type cladding layer side of the AlGaInP based semiconductor layers 5 is flat, however, an irregularity (unevenness) may be provided on the surface of the window layer 19.

Further, an main surface oxide layer may be provided on the surface of the window layer 19 (namely, the main surface of the AlGaInP based semiconductor layers 5), in which the main surface oxide layer comprises an oxide material having a refractive index between a refractive index of the window layer 19 and the a refractive index of the air or between the refractive index of the window layer 19 and a refractive index of a resin. At this time, the main surface oxide layer comprises at least one of $SiO_2$ and SiN.

Herein the resin is provided as a package for sealing the semiconductor light emitting device 1 provide as a bare chip, to mechanically protect the semiconductor light emitting device 1, to form a uniform shape, and to provide a lens effect and scattering effect, in order to form a LED lump as a product. The refractive index of the main surface of the oxide layer is greater than that of the resin and smaller than that of the main surface of the semiconductor light emitting device 1 (i.e. the refractive index of the main surface of the semiconductor light emitting device 1>the refractive index of the main surface oxide layer>the refractive index of the resin). Therefore, the refractive index of the resin is the lowest.

EXAMPLES

Example 1

An epitaxial wafer (wafer 25) for a red LED having a light emitting wavelength of around 630 nm, having a structure shown in FIG. 2 was manufactured. The detailed manufacturing process such as epitaxial growth process, composition ratio, film thickness, carrier concentration, dopant, and conductivity type of each layer, method of forming electrodes, and method of fabricating the LED device is as follows.

On an n-type (Si-doped) GaAs substrate (substrate for growth) 22, an n-type (Se-doped) $(Al_{0.7}Ga_{0.3})_{0.5}In_{0.5}P$ etching stopper layer (a film thickness of 200 nm and a carrier concentration of $1\times10^{17}/cm^3$) 23, an n-type (Se-doped) GaAs LED main surface side contact layer (a film thickness of 100 nm and a carrier concentration of $1\times10^{18}/cm^3$) (a layer for forming a first electrode side contact layer 16) 24, an n-type (Se-doped) $(Al_{0.4}Ga_{0.6})_{0.5}In_{0.5}P$ window layer (a film thickness of 1000 nm and a carrier concentration of $1.2\times10^{18}/cm^3$) 19, an n-type (Se-doped) $(Al_{0.7}Ga_{0.3})_{0.5}In_{0.5}P$ first conductivity type cladding layer (a film thickness of 500 nm and a carrier concentration of $5\times10^{17}/cm^3$) 2, an undoped multilayer (first side multilayer) 9, an undoped MQW active layer (active layer) 4, an undoped multilayer (second side multilayer) 10, a p-type (Mg-doped) $(Al_{0.7}Ga_{0.3})_{0.5}In_{0.5}P$ second conductivity type cladding layer (a film thickness of 400 nm and a carrier concentration of $1\times10^{18}/cm^3$) 3, a p-type (Mg-doped) $Ga_{0.6}In_{0.4}P$ interposed layer (a film thickness of 10 nm and a carrier concentration of $1.2\times10^{19}/cm^3$) 12, a p-type (Mg-doped) GaP contact layer (a film thickness of 400 nm and a carrier concentration of $1.2\times10^{19}/cm^3$) (first divided contact layer) 13, an undoped GaP contact layer (a film thickness of 100 nm) (second divided contact layer) 14, and a p-type (Zn-doped) GaP contact layer (a film thickness of 100 nm and a carrier concentration of $1.2\times10^{19}/cm^3$) (third divided contact layer) 15 were sequentially grown by the MOVPE method to provide an epitaxial wafer 25 on which AlGaInP based semiconductor layers 5 are laminated.

In each of the first side multilayer 9 and the second side multilayer 10, a layer comprising an $(Al_{0.4}Ga_{0.6})_{0.5}In_{0.5}P$ (a film thickness of 10 nm) and a layer comprising an $(Al_{0.7}Ga_{0.3})_{0.5}In_{0.5}P$ (a film thickness of 10 nm) constitute one pair, and 4.5 pairs of this combination are provided.

In the active layer 4, a layer comprising an $(Al_{0.6}Ga_{0.4})_{0.5}In_{0.5}P$ (a film thickness of 10 nm) and a layer comprising a $Ga_{0.5}In_{0.5}P$ (a film thickness of 10 nm) constitute one pair and 39.5 pairs of this combination are provided.

A growth temperature for the MOVPE method is 650° C. for growth from the etching stopper layer 23 to the third divided contact layer 15, a growth pressure is 6666 Pa (50 Torr), a growth rate of each layer is from 0.3 nm/sec to 1.0 nm/sec, and a V/III ratio is about 50 to 150.

The V/III ratio is a proportion (quotient) in that a mol number of III group material such as TMGa (trimethylgallium), TMAl (trimethylaluminum) is a denominator, and a mol number of V group material such as $AsH_3$ (arsine), $PH_3$ (phosphine) is a numerator.

As an organic metal for a source in the MOVPE method, a source of Ga is trimethylgallium (TMGa) or triethylgallium (TEGa), a source of Al is trimethylaluminum (TMAl), and a source of In is trimethylindium (TMIn). As to a hydride gas, a source of As is $AsH_3$, and a source of P is $PH_3$.

As a dopant source for the n-type layer such as the etching stopper layer 23, hydrogen selenide ($H_2Se$) is used. As the dopant source for the p-type layer such as the second conductivity type cladding layer 3, bis(cyclopentadienyl)magnesium ($Cp_2Mg$) is used. As the dopant source for the p-type layer such as the third divided contact layer 15, diethylzinc (DEZn) is used. In addition, as the dopant source for the n-type semiconductor layer, disilane ($Si_2H_6$), monosilane ($SiH_4$), or diethyl tellurium (DETe) may be used. As the dopant source of Zn, dimethylzinc (DMZn) may be used.

After extracting the wafer 25 thus fabricated from the MOVPE apparatus, a $SiO_2$ layer for forming an oxide layer 18 is formed to have a film thickness of about 105 nm on a surface of third divided contact layer 15, and the etching process was further conducted by using a general photolithography technique with use of a resist and a mask aligner, to remove a part of the $SiO_2$ layer, so as to form a hole for forming an ohmic contact portion 17. The ohmic contact portion 17 was formed in the hole by vacuum deposition method. Herein, the part of the $SiO_2$ layer other than the ohmic contact portion 17 is the oxide layer 18.

As a material of the ohmic contact portion 17, a gold-zinc (AuZn) alloy was used. A surface-viewed diameter of the ohmic contact portion 17 was about 10 μm. This ohmic contact portion 17 was formed to have a thickness of 105 nm with a surface-viewed pitch of 30 μm. Thereafter, the ohmic contact portion 17 is alloyed by alloying process of conducting a heat treatment at a temperature of 400° C. in an atmosphere of nitrogen gas for 5 minutes.

Next, the reflective metal film 8 is formed on the ohmic contact portion 17 and the oxide layer 18. As the reflective metal film 8, aluminum (Al), titanium (Ti), and gold (Au) were deposited in this order to have a film thickness of 200 nm, 200 nm, and 500 nm, respectively.

Next, a GaAs substrate 21 was prepared as a supporting substrate. As a metal adhesion layer 20, gold/germanium (AuGe) alloy, titanium (Ti), and gold (Au) were deposited in this order to have a film thickness of 100 nm, 100 nm, and 500 nm on the GaAs supporting substrate 21.

The Au layer of the metal adhesion layer 20 deposited on the GaAs supporting substrate 21 is stuck to the reflective metal film 8 of the wafer 25. The sticking process was conducted by holding the wafer 25 and the GaAs supporting substrate 21 at a temperature of 350° C. in the state of a load of 30 kgf/cm$^2$ in an atmosphere of a pressure of 1.3 Pa for 60 minutes.

After protecting the surface of the GaAs substrate with a resist, the wafer 25 stuck to the GaAs supporting substrate 21 is into ammonia water and hydrogen peroxide water based mixed liquid, so that the GaAs substrate 21 for growth was removed by the etching to expose the etching stopper layer 23. Thereafter, the etching stopper layer 23 was removed by using a hydrochloric acid to expose the layer 24 for forming the first electrode side contact layer 16. Then, the resist on the GaAs substrate 21 was removed by using acetone and methanol.

On a surface of the layer 24 for forming the first electrode side contact layer 16, by using the general photolithography technique with use of the resist and the mask aligner and the vacuum deposition, a surface electrode (first electrode) 6 comprising a circular portion with a surface-viewed diameter of 100 μm and branches extending radially with a width of 10 μm from the circular portion was formed by the vacuum deposition. As the first electrode 6, gold/germanium (AuGe) alloy, titanium (Ti), and gold (Au) were deposited in this order to have a film thickness of 100 nm, 100 nm, and 500 nm, respectively.

After forming the first electrode 6, the layer 24 was etched by using the first electrode 6 as a mask and an etching liquid comprising a mixed liquid of sulfuric acid, hydrogen peroxide water and water as an etchant. After this etching, a part of the layer 24 overlapping with the first electrode 6 was selectively remained to provide the first electrode side contact layer 16. The part which does not overlap with the first electrode 6 in the layer 24 was removed to expose the window layer 19.

Subsequently, the second electrode 7 was formed by the vacuum deposition on an entire surface of the GaAs supporting substrate 21. In more concrete, gold/germanium (AuGe) alloy, titanium (Ti), and gold (Au) were deposited in this order to have a film thickness of 60 nm, 10 nm, and 500 nm. Thereafter, by an alloying process of conducting a heat treatment at a temperature of 400° C. in an atmosphere of nitrogen gas for 5 minutes, the second electrode 7 was alloyed.

The wafer 25 comprising the GaAs substrate 21 on which the second electrode 7 was formed was cut by using a dicing apparatus, such that the circular portion of the first electrode 6 is located at a center of a chip, to provide an LED bare chip with dimensions of 300 μm×300 μm. The LED bare chip was mounted (die-bonding) on a TO-18 stem, and wire bonding is conducted for the LED bare chip, to provide an LED device.

The initial characteristics of the LED device in the Example 1 were evaluated. As the initial characteristics, the light output was 5.35 mW and an operating voltage was 2.07 V at a current flow of 20 mA (at the time of evaluation). Further, so as to evaluate the reliability characteristics, this LED device was operated with a current flow of 50 mA at an ambient temperature and at a normal humidity, and a continuous electrification test was conducted for 168 hours (1 week). As a result, a relative comparative value before and after the continuous electrification test was an output of 103% (100% before the continuous electrification test). As described above, the good result in the reliability characteristics was obtained.

In the Example 1, the number of pairs in the active layer 4 is 39.5 pairs. As variations of the Example 1, samples of the LED device in which the number of pairs is 2, 5, 10, 20, 30, 60, and 80, respectively were manufactured. In the samples of the variations of the Example 1, the LED devices comprising the active layer 4 in which the number of pairs is from 5 to 30 have the initial characteristics and the reliability characteristics similar to those of the LED device in the Example 1. However, when the number of pairs exceeds 40, there is a tendency that the light output is decreased since the light absorption in the active layer 4 is increased.

FIG. 7 is a graph showing a relationship between a light output and the number of MQW pairs of the semiconductor light emitting device in the preferred embodiment according to the invention.

As shown in FIG. 7, when the number of pairs is less than 10, the light output is dramatically increased in accordance with an increase in the number of pairs. When the number of pairs is greater than 5, the light output is sufficiently high. When the number of pairs is from 10 to 40, the light output is sufficiently high.

Further, an irregularity was provided on the main surface of the LED device in the Example 1 by using the hydrochloric acid based etching liquid (rough-surface treatment). In the LED device in this variation of forming the irregularity, an initial light output of 6.86 mW can be obtained.

Still further, a SiN film was formed on an uppermost surface of the LED device in the variation of forming the irregularity in the Example 1. In the LED device in this variation of forming the SiN film, an initial light output of 8 mW can be obtained. Both in the variation of forming the irregularity and in the variation of forming the SiN film on the irregularity, the relative comparative values before and after the continuous electrification test showing the reliability characteristics were 100%. As described above, the reliability of the LED devices in these variations are good.

As understood from the experimental result of the Example 1, the improvement in the light output is affected by the improvement in the current spreading property because of provision of the first side multilayer 9 and the second side multilayer 10, and the decrease in the light absorption in the active layer 4.

Example 2

A wafer 31 for a red LED having a light emitting wavelength of around 630 nm, having a structure shown in FIG. 3 was manufactured. Then, a LED device in the Example 2 was manufactured by using the wafer 31. The LED device in the Example 2 is similar to the LED device in the Example 1, except the second side multilayer 10 is not provided.

As a result of evaluating the initial characteristics of the LED device in the Example 2, the light output was 4.82 mW at a current flow of 20 mA (at the time of evaluation), so that the high light output was obtained. The relative comparative values before and after the continuous electrification test was 102% which shows a good reliability.

Example 3

A wafer 41 for a red LED having a light emitting wavelength of around 630 nm, having a structure shown in FIG. 4 was manufactured. Then, a LED device in the Example 3 was manufactured by using the wafer 41. The LED device in the Example 3 is similar to the LED device in the Example 1, except the first side multilayer 9 is not provided.

As a result of evaluating the initial characteristics of the LED device in the Example 3, the light output was 5.03 mW at a current flow of 20 mA (at the time of evaluation), so that the high light output was obtained. The relative comparative values before and after the continuous electrification test was 98% which shows a good reliability.

Example 4

A wafer 52 for a red LED having a light emitting wavelength of around 630 nm, having a structure shown in FIG. 5 was manufactured. Then, a LED device in the Example 4 was manufactured by using the wafer 52. The LED device in the Example 4 is similar to the LED device in the Example 1, except a second conductivity type cladding layer side contact layer 51 does not comprise the second divided contact layer 14, and the Zn-doped third divided contact layer 15 and the Mg-doped first divided contact layer 13 are contacted to each other. Further, a film thickness of the Mg-doped first divided contact layer 13 is 500 nm, such that a total film thickness of the second conductivity type cladding layer side contact layer 51 is equal to a total film thickness of the second conductivity type cladding layer side contact layer 11 in the Example 1.

As a result of evaluating the initial characteristics of the LED device in the Example 4, the light output was 4.85 mW at a current flow of 20 mA (at the time of evaluation), so that the initial characteristics were good. The relative comparative values before and after the continuous electrification test was 93% which shows a good reliability.

Comparative Example

Figure 6:
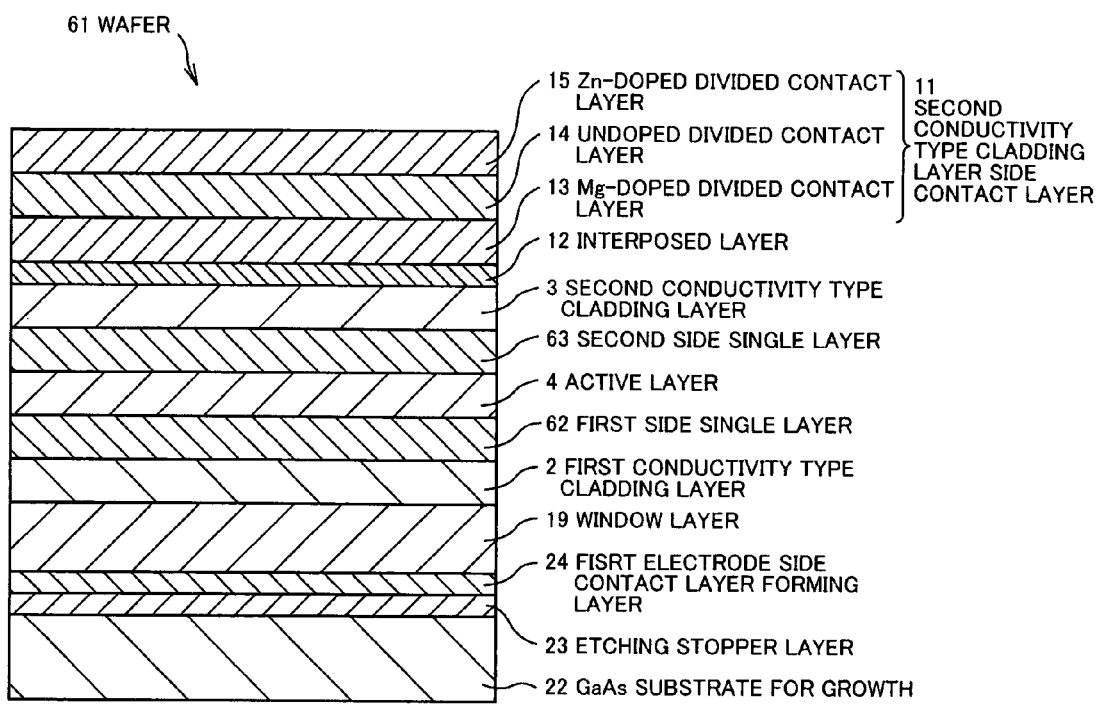
FIG. 6 is a schematic cross sectional view showing a structure of a wafer for manufacturing a semiconductor light emitting device of a comparative example.

FIG. 6 is a schematic cross sectional view showing a structure of a wafer for manufacturing a semiconductor light emitting device of a comparative example.

For comparing with the Examples 1 to 4 according to the invention, a wafer 61 for a red LED having a light emitting wavelength of around 630 nm, having a structure shown in FIG. 6 was manufactured. Then, a LED device in the comparative example was manufactured by using the wafer 61.

As shown in FIG. 6, the wafer 61 comprises a GaAs substrate 22 for growth, an etching stopper layer 23, a layer 24 for forming first electrode side contact layer 16, a window layer 19, a first conductivity type cladding layer 2, a first side single layer 62, an active layer 4, a second side single layer 63, a second conductivity type cladding layer 3, an interposed layer 12, and a Mg-doped first divided contact layer 13, an undoped second divided contact layer 14, and a Zn-doped third divided contact layer 15. The wafer 61 in the comparative example is similar to the wafer 25 in the Example 1, except that first side single layer 62 and the second side single layer 63 are provided instead of the first side multilayer 9 and the second side multilayer 10, respectively.

The detailed manufacturing process such as epitaxial growth process, composition ratio, film thickness, carrier concentration, dopant, and conductivity type of each layer, method of forming electrodes, and method of fabricating the LED device is as follows.

On an n-type Si-doped GaAs substrate for growth (light absorbing semiconductor substrate) 22, an n-type (Se-doped) $(Al_{0.7}Ga_{0.3})_{0.5}In_{0.5}P$ etching stopper layer (a film thickness of 200 nm and a carrier concentration of $1\times10^{17}/cm^3$) 23, an n-type (Se-doped) GaAs LED main surface side contact layer (a film thickness of 100 nm and a carrier concentration of $1\times10^{18}/cm^3$) (a layer for forming a first electrode side contact layer 16) 24, an n-type (Se-doped) $(Al_{0.4}Ga_{0.6})_{0.5}In_{0.5}P$ window layer (a film thickness of 1000 m and a carrier concentration of $1.2\times10^{18}/cm^3$) 19, an n-type (Se-doped) $(Al_{0.7}Ga_{0.3})_{0.5}In_{0.5}P$ first conductivity type cladding layer (a film thickness of 500 nm and a carrier concentration of $5\times10^{17}/cm^3$) 2, an undoped single layer (first side single layer) 62, an undoped MQW active layer (active layer) 4, an undoped single layer (second side single layer) 63, a p-type (Mg-doped) $(Al_{0.7}Ga_{0.3})_{0.5}In_{0.5}P$ second conductivity type cladding layer (a film thickness of 400 nm and a carrier concentration of $1\times10^{18}/cm^3$) 3, a p-type (Mg-doped) $Ga_{0.6}In_{0.4}P$ interposed layer (a film thickness of 10 nm and a carrier concentration of $1.2\times10^{19}/cm^3$) 12, a p-type (Mg-doped) GaP contact layer (a film thickness of 400 nm and a carrier concentration of $1.2\times10^{19}/cm^3$) (first divided contact layer) 13, an undoped GaP contact layer (a film thickness of 100 nm) (second divided contact layer) 14, and a p-type (Zn-doped) GaP contact layer (a film thickness of 100 nm and a carrier concentration of $1.2\times10^{19}/cm^3$) (third divided contact layer) 15 were sequentially grown by the MOVPE method to provide an epitaxial wafer 61 on which AlGaInP based semiconductor layers 5 are laminated.

Each of the first side single layer 62 and the second side single layer 63 comprises an $(Al_{0.7}Ga_{0.3})_{0.5}In_{0.5}P$ (a film thickness of 10 nm).

Similarly to the Example 1, an LED device using the wafer 61 in the comparative example was manufactured.

As a result of evaluating the initial characteristics of the LED device in the comparative example, the light output was 3.54 mW and the operating voltage was 1.98 V at a current flow of 20 mA (at the time of evaluation). The relative comparative values before and after the continuous electrification test was 85%. Accordingly, the initial characteristics and the reliability characteristics of the LED device in the comparative example are inferior to those of the LED devices in the Examples 1 to 4.

FIG. 8 is a graph showing a relationship between a light output and the number of MQW pairs of the semiconductor light emitting device of the comparative example.

As to the LED device in the comparative example, samples having different number of pairs in the active layer 4 were prepared, and a relationship between the number of pairs and the light output was examined. FIG. 8 shows the result of the characteristics of the samples.

In the comparative example, by preparing samples with different pair numbers in the active layer 4 for three kinds of wafers having epitaxial wafer structures partially different from each other, the light output of the LED devices manufactured by using the respective wafers were evaluated.

As a result, it is confirmed that the light output is increased in accordance with the increase in the number of MQW pairs constituting the active layer. In other words, the light output is increased in accordance with the increase in the number of hetero junctions.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor light emitting device, comprising:
   AlGaInP based semiconductor layers, comprising:
   a first conductivity type cladding layer;
   a second conductivity type cladding layer doped with Mg; and
   an active layer sandwiched by the first conductivity type cladding layer and the second conductivity type cladding layer, and generating a light;

a first electrode for partially covering a main surface;

a second electrode for covering an opposite surface opposite to the main surface; a reflective metal film provided between the second conductivity type cladding layer and the second electrode, and reflecting the light advanced from the active layer; and a second conductivity type contact layer provided between the second conductivity type cladding layer and the reflective metal film, the second conductivity type contact layer comprising divided contact layers comprising a first, a second, and a third divided contact layer, each of the divided contact layers comprising a same material, wherein the same material of the first divided contact layer is Zn-doped, the same material of the second conductivity layer is undoped, and the material of the third divided contact layer is Mg-doped, the first, the second, and the same third divided contact layers are laminated in this order, and wherein the Mg-doped layer is provided at a side close to the second conductivity cladding layer.

2. The semiconductor light emitting device according to claim 1, wherein the second conductivity type contact layer comprises the same material selected from the same group consisting of GaP, AlGaAs, GaAsP, AlGaInP, and GaInP.

3. The semiconductor light emitting device according to claim 2, further comprising:

an interposed layer comprising $Ga_{X2}In_{1-X2}P$ ($0.6 \leq X2 < 1$) the interposed layer being provided between the first conductivity type cladding layer and the second conductivity type contact layer.

4. The semiconductor light emitting device according to claim 1, wherein the active layer comprises a multiquantum well structure in which a pair number is from 5 to 40.

5. The semiconductor light emitting device according to claim 1, wherein the active layer comprises a single structure and a film thickness of the active layer is from 20 nm to 200 nm.

6. The semiconductor light emitting device according to claim 1, wherein ohmic contact portions are provided in openings of an insulative oxide layer between the AlGaInP based semiconductor layers and the reflective metal film, and regions corresponding to the openings are not covered by the first electrode.

7. The semiconductor light emitting device according to claim 6, wherein said insulative oxide layer is provided between the ohmic contact portions that are sandwiched by the AlGaInP based semiconductor layers and the reflective metal film.

8. The semiconductor light emitting device according to claim 7, wherein a film thickness D of the insulative oxide layer is within a range of ±30% of a value d expressed as:

$$d = A \times \lambda p / 4 \times n,$$

wherein d is the film thickness of the insulative oxide layer, A is a constant of an odd number, λp is a wavelength of the light emitted from the active layer, and n is a refractive index of the light emitted from the active layer.

9. The semiconductor light emitting device according to claim 6, wherein the ohmic contact portions comprise an Au based alloy.

10. The semiconductor light emitting device according to claim 6, wherein the openings in the insulative oxide layer comprise gaps between respective portions of the insulative oxide layer.

11. The semiconductor light emitting device according to claim 1, wherein a multilayer, formed by laminating a plurality of layers, is provided at least in one of between the first conductivity type cladding layer and the active layer, and between the active layer and the second conductivity type cladding layer, the multilayer being transparent with respect to the light generated at the active layer, having a bandgap larger than that of the active layer, and lattice-matched with the active layer.

12. The semiconductor light emitting device according to claim 11, wherein the multilayer comprises an $(Al_{X1}Ga_{1-X1})_{Y1}In_{1-Y1}P$ ($0.3 \leq X1 < 1, 0.4 \leq Y1 \leq 0.6$).

13. The semiconductor light emitting device according to claim 11, wherein a thickness of each layer of said plurality of layers of the multilayer is from 3 nm to 15 nm.

14. The semiconductor light emitting device according to claim 1, wherein the Zn-doped layer comprises a Zn-doped GaP contact layer with a carrier concentration greater than $1.0 \times 10^{19}/cm^3$, the Zn-doped layer is in contact with an ohmic-contact portion, the undoped layer comprises an undoped GaP contact layer, and the Mg-doped layer comprises an Mg-doped GaP contact layer with a carrier concentration greater than $1.0 \times 10^{19}/cm^3$.

15. The semiconductor light emitting device according to claim 14, further comprising an Mg-doped GaInP interposed layer provided between the second conductivity type cladding layer and the Mg-doped GaP contact layer, the Mg-doped GaInP interposed layer comprising a carrier concentration equal to the carrier concentration of the Mg-doped GaP contact layer.

\* \* \* \* \*